(12) United States Patent
Kang et al.

(10) Patent No.: US 11,906,905 B2
(45) Date of Patent: Feb. 20, 2024

(54) PRESERVING HIERARCHICAL STRUCTURE INFORMATION WITHIN A DESIGN FILE

(71) Applicant: Applied Materials, Inc., Santa Clara, CA (US)

(72) Inventors: Chung-Shin Kang, San Jose, CA (US); Yinfeng Dong, San Jose, CA (US); Rick R. Hung, Tainan (TW); Yao Cheng Yang, Mountain View, CA (US); Tsaichuan Kao, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/767,020

(22) PCT Filed: Nov. 15, 2019

(86) PCT No.: PCT/US2019/061731
§ 371 (c)(1),
(2) Date: Apr. 6, 2022

(87) PCT Pub. No.: WO2021/096530
PCT Pub. Date: May 20, 2021

(65) Prior Publication Data
US 2022/0365443 A1    Nov. 17, 2022

(51) Int. Cl.
*G03F 7/20*    (2006.01)
*G03F 7/00*    (2006.01)

(52) U.S. Cl.
CPC ...... *G03F 7/70433* (2013.01); *G03F 7/70508* (2013.01)

(58) Field of Classification Search
CPC ............ G03F 7/70433; G03F 7/70508; G03F 7/70291; G06F 30/398; H01L 22/20; H01L 21/027
See application file for complete search history.

(56) References Cited

U.S. PATENT DOCUMENTS 7,013,451 B1    3/2006    Teig et al.
9,760,671 B2 *  9/2017    Berkens ............... G06F 30/398
(Continued)

FOREIGN PATENT DOCUMENTS

JP    2006276491 A    10/2006
JP    2006350013 A    12/2006
JP    2016189220 A    11/2016

OTHER PUBLICATIONS

International Search Report and Written Opinion dated Aug. 14, 2020 for Application No. PCT/US2019/061731.
(Continued)

*Primary Examiner* — Mesfin T Asfaw
(74) *Attorney, Agent, or Firm* — Patterson + Sheridan, LLP

(57) ABSTRACT

A verification device for verifying a design file for digital lithography comprises a memory and a controller. The memory comprises the design file. The controller is configured to access the design file and apply one or more compliance rules to the design file to determine compliance of the design file. The compliance rules comprises at least one of detecting non-orthogonal edges within the design file, detecting non-compliant overlapping structures within the design file, and detecting a non-compliant interaction between a reference layer of the design file and a target layer of the design file. The controller is further configured to verify the design file in response to a comparison of a number of non-orthogonal edges, non-compliant overlapping structures and non-compliant interactions to a threshold.

20 Claims, 7 Drawing Sheets

(56) References Cited

U.S. PATENT DOCUMENTS

| | | |
|---|---|---|
| 2003/0074646 A1 | 4/2003 | Kotani et al. |
| 2009/0265673 A1 | 10/2009 | Avanessian et al. |
| 2010/0153903 A1 | 6/2010 | Inoue et al. |
| 2012/0124536 A1 | 5/2012 | Sharma |
| 2013/0326439 A1 | 12/2013 | Matsuoka et al. |
| 2015/0125077 A1 | 5/2015 | Ivansen et al. |
| 2015/0302134 A1 | 10/2015 | Berkens |
| 2016/0078164 A1 | 3/2016 | Hsieh et al. |

OTHER PUBLICATIONS

European Search report for Application No. 19952433.1 dated Jun. 28, 2023.
Office Action for Japanese Application No. 2022-526340 dated Jul. 25, 2023.

* cited by examiner

PRESERVING HIERARCHICAL STRUCTURE INFORMATION WITHIN A DESIGN FILE

BACKGROUND

Field

Embodiments of the present disclosure generally relate to verifying design files for a digital lithography system.

Description of the Related Art

Lithography methods are used in the manufacturing of semiconductor devices. Conventional lithography methods include transferring design patterns onto a set of photomasks which are transferred on to a photoresist. In a digital lithography process design patterns are digitized directly onto the photoresist using an imaging process. However, the amount of data that is transferred to digitize the photoresist is large, limiting the speed of the digital lithography process. Further, current verification methods remove the structural information from the design file.

Accordingly, what is needed in the art is a method to reduce the data volume while also maintaining the hierarchical structural information of the design file.

SUMMARY

In one example embodiment, a method comprises accessing a design file for a digital lithography device and applying one or more compliance rules to the design file to determine compliance. Applying the one or more compliance rules comprises detecting non-orthogonal edges within the design file, detecting non-compliant overlapping structures within the design file, and detecting a non-compliant interaction between a reference layer of the design file and a target layer of the design file. The method further comprises verifying the design file in a response to a comparison of a number of non-orthogonal edges, non-compliant overlapping structures and non-compliant interactions to a threshold.

In one example embodiment, a verification device for verifying a design file for digital lithography comprises a memory and a controller. The memory comprises the design file. The controller is configured to access the design file and apply one or more compliance rules to the design file to determine compliance of the design file. The compliance rules comprises at least one of detecting non-orthogonal edges within the design file, detecting non-compliant overlapping structures within the design file, and detecting a non-compliant interaction between a reference layer of the design file and a target layer of the design file. The controller is further configured to verify the design file in response to a comparison of a number of non-orthogonal edges, non-compliant overlapping structures and non-compliant interactions to a threshold.

In one example embodiment, a computer program product verifying a design file for digital lithography comprises a computer-readable storage medium having computer-readable program code embodied therewith. The computer-readable program code executable by one or more computer processors to access the design file, apply one or more compliance rules to the design file to determine compliance of the design file, and verify the design file in a response to a comparison of a number of non-orthogonal edges, non-compliant overlapping structures and non-compliant interactions to a threshold. Applying one or more compliance rules to the design file comprises at least one of detecting non-orthogonal edges within the design file, detecting non-compliant overlapping structures within the design file, and detecting a non-compliant interaction between a reference layer of the design file and a target layer of the design file.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein provide a method for verifying a design file which is optimized to undergo digital pattern conversion while maintaining at least a portion of the hierarchical structure information within the original design file to reduce the total data volume and avoid data congestion. The method includes evaluating a design file against a set of compliance rules to detect non-compliant cells of the design file. A list of the non-compliant cells and/or location markers may be presented to a user for corrective action. When the design file is determined to satisfy a threshold based on the ratio of non-compliant cells and/or location markers, the design file may be verified. The verified design file may be communicated to a controller of a digital lithography system for processing.

Figure 1:
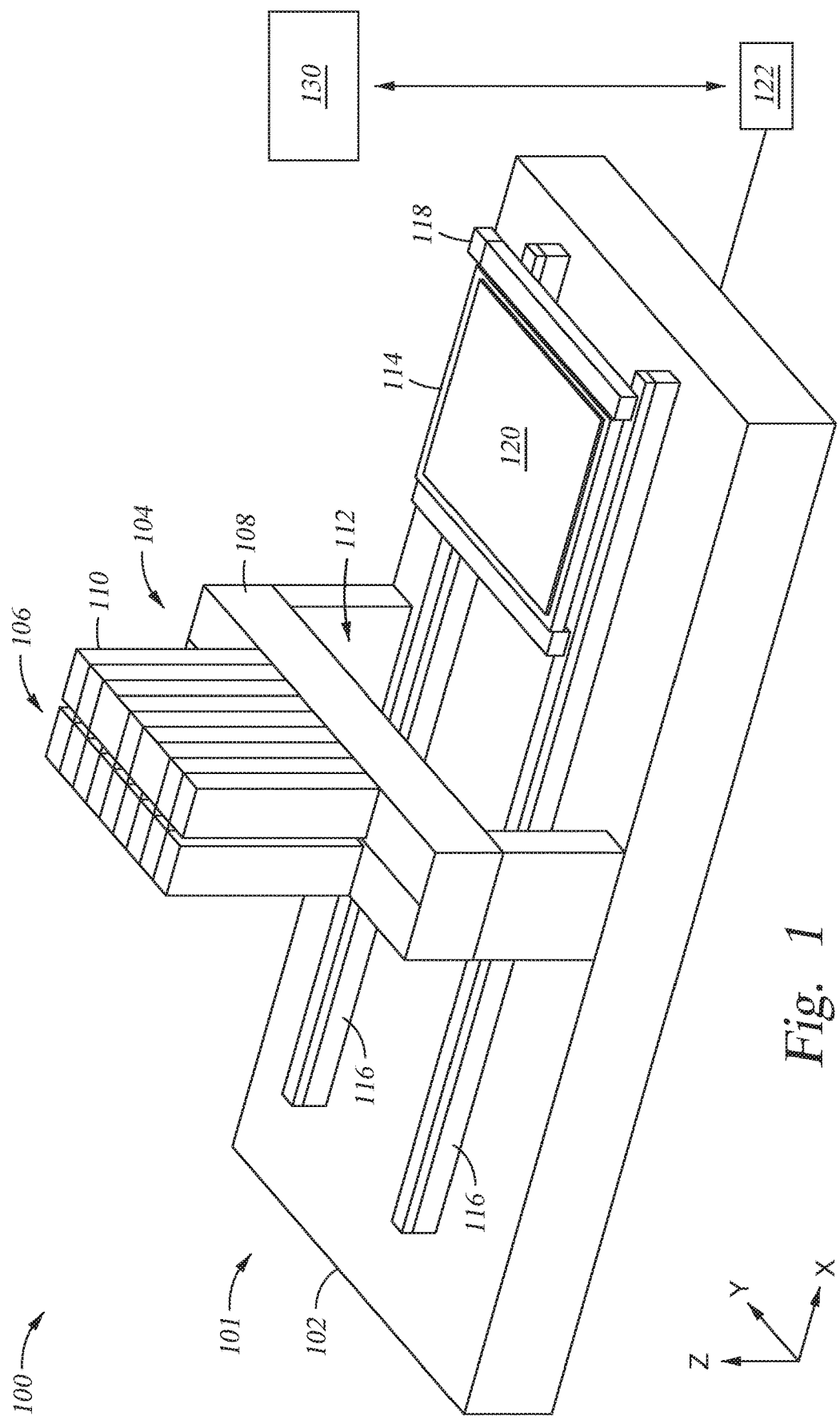
FIG. 1 is a schematic view of digital lithography system, according to one or more embodiments.

FIG. 1 is a perspective view of a digital lithography system 100, according to one or more embodiments. The system 100 includes a digital lithography digital lithography device 101 and verification device 130. The digital lithography device 101 includes a stage 114 and a processing apparatus 104. The stage 114 is supported by a pair of tracks 116 disposed on a slab 102. A substrate 120 is supported by the stage 114. The stage 114 is supported by a pair of tracks 116 disposed on the slab 102. The stage 114 moves along the pair of tracks 116 in the X direction as indicated by the coordinate system shown in FIG. 1. In one embodiment, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of a digital lithography process based on a design file provided by the verification device 130. The design file (or computer instructions), which may be referred to as an imaging design file, readable by the controller 122, determines which tasks are performable on a substrate. The design file (e.g., the design file 220 of FIG. 2) includes a mask pattern data and code to monitor and control the processing time and substrate position. The mask pattern data corresponding to a pattern to be written into the photoresist using the electromagnetic radiation.

The substrate 120 comprises any suitable material, for example, glass, which is used as part of a flat panel display. In other embodiments, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example UV or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is pattern etched through the openings in the photoresist to form a portion of the electronic circuitry of the display panel.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. In one embodiment, the processing unit 106 is a pattern generator configured to expose photoresist in a photolithography process. In some embodiments, the pattern generator is configured to perform a maskless lithography process. The processing unit 106 includes a plurality of image projection systems.

During operation, the stage 114 moves in the X direction from a loading position, as shown in FIG. 1, to a processing position. The processing position is one or more positions under the processing unit 106. Herein, the digital lithography device 101 is schematically shown, wherein the digital lithography device 101 is sized to be capable of exposing the entire width of the photoresist layer on the substrate 120 in the Y direction, i.e. the substrate 120 is small compared to those of an actual flat panel display substrate. However, in an actual processing system, the processing apparatus 104 will be significantly smaller, in the Y direction, than the width of the substrate 120 in the Y direction, and the substrate 120 will be sequentially moved in the −X direction under the processing apparatus 104, moved or stepped in the +Y direction, scanned backed in the +X direction under the processing apparatus 104. This X direction scanning and Y direction stepping operation will continue until the entire substrate area has passed under the writable area of the processing apparatus 104.

Figure 2:
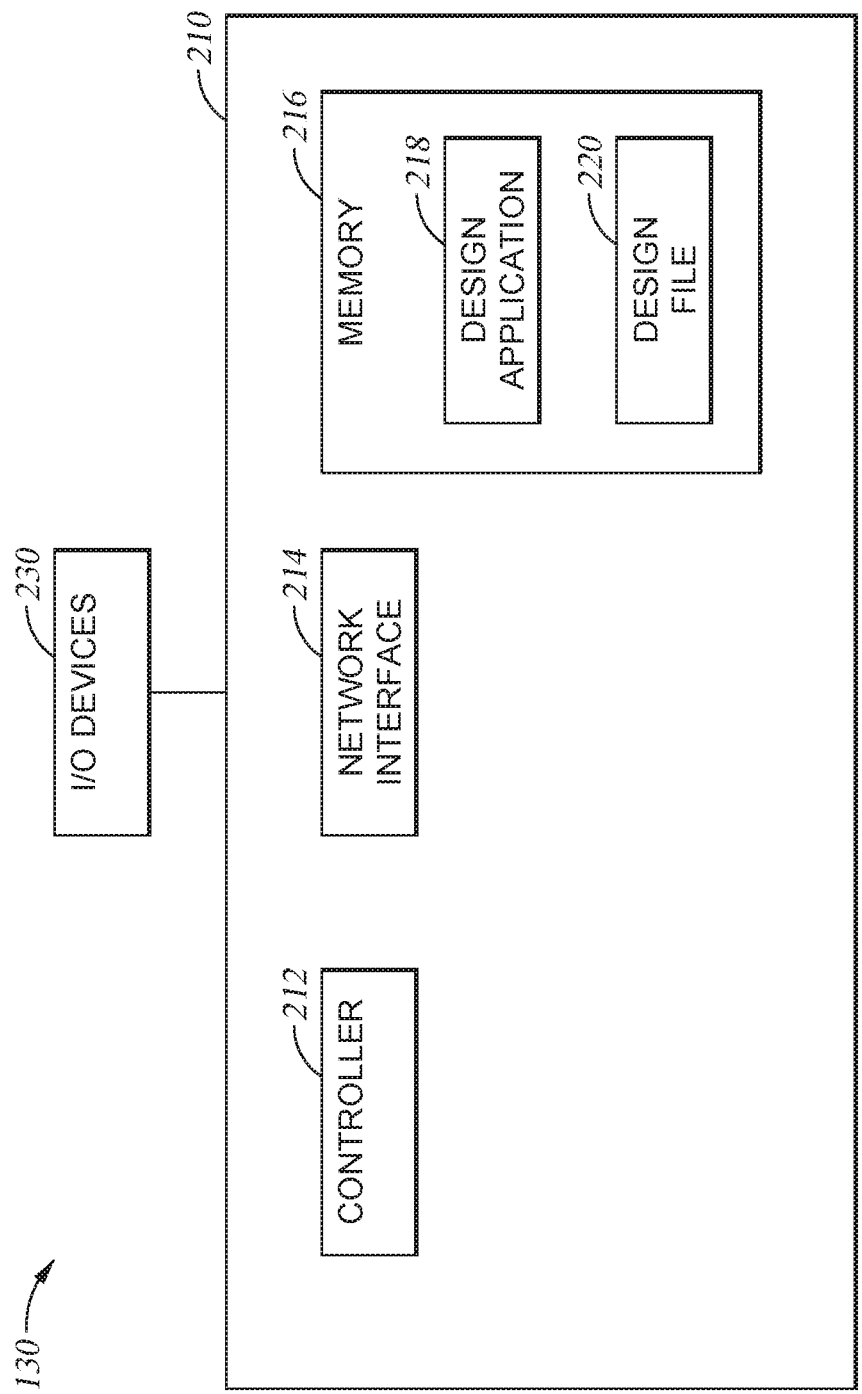
FIG. 2 is a schematic view of a verification device, according to one or more embodiments.

FIG. 2 illustrates the verification device 130, according to one or more embodiments. The verification device 130 includes a computing device 210 and input/output (I/O) devices 230. The verification device 130 may be utilized to generate, optimize, verify, and/or update a design file (e.g., the design file 220).

The computing device 210 may include a controller 212, a network interface 214, and a memory 216. The controller 212 retrieves and executes programing data stored in the memory 216 and coordinates operations of other system components. Similarly, the controller 212 stores and retrieves application data residing in the memory 216. The controller 212 may be one or more central processing units (CPUs).

The memory 216 may store instructions and logic to be executed by the controller 212. Further, the memory 216 may be one or more of a random access memory (RAM) and a non-volatile memory (NVM). The NVM may be a hard disk, a network attached storage (NAS), and a removable storage device, among others. Further, the memory 216 may include a design application 218 and a design file 220.

The design application 218 generates, optimizes, verifies, and/or updates the design data of the design file 220. The design application 218 may be controlled by the controller 212 to generate, optimize, and/or update the design data of the design file 220.

The design file 220 may be stored within the memory and is accessible by the controller 212 and the design application 218. The design file 220 may include design data that may be interpreted by the controller 122 to pattern the substrate 120. For example, the design file 220 is indicative of hierarchical physical design (layout) data. The hierarchical physical design data may be composed of core pixel and peripheral logic areas. The core pixel area may be highly repetitive, representing more than 90% of the design data. Further, maintaining the hierarchical structure decreases the volume of data that is transferred to the controller 122. For example, the data volume may be decreased by about 100 to about 1000 times as compared to the application of global biasing with hierarchical geometry engine. The data inflation may result in failure to transmit data within the data path. Further, the design application 218 may optimize the global sizing within cell level sizing and hierarchical repair. The design file 220 may also be referred to as design pattern file. The design file 220 may be provided in different formats. For example, the format of the design file 220 may be one of a GDS format and an OASIS format, among others. The design data of the design file 220 includes cells having structures of pattern to be generated on a substrate (e.g., the substrate 120). A cell may be a grouping of the logical elements of a transistor or another element of a semiconductor device. Additionally, a cell may contain geometrical objects such as polygons (boundaries, paths, and other cells. Objects in the cells are assigned to "layers" of the corresponding design. The different layers may represent different processing steps within a lithography process. A cell may be referenced whenever that element is to be drawn. For example, a cell corresponding to a transistor may be referenced whenever a transistor is to be drawn. Further, a cell may span one or more layers within the design of the design file. A cell hierarchy may include one or more cells. For example, a top level cell may include all elements of the corresponding object, and each cell within lower levels of the hierarchy may include elements of a different part of the object. The design file 220 may be in the form of pixel cells, a Bitmap or similar file. The design file 220 may include areas of interest which correspond to one or more structures. The structures may be constructed as geometrical shapes. Further, areas of interest may be represented as cell during a verification and/or optimization process.

The I/O devices 230 may include one or more of a keyboard, display device, mouse, audio device, and a touch screen, among others. The I/O devices 230 may be utilized to enter information into the verification device 130 and/or output data from the verification device 130. For example, a user may use a keyboard and a pointing device to generate and/or adjust elements of the design file 220.

The network interface 214 may transmit data via a communication network. For example, the network interface 214 may transmit a design file to digital lithography device 101 via a communication network.

Global sizing of the design file 220 allows the exposure dose to be set at a higher value such that structures within the design file 220 may be printed at the size indicated by the design file 220. Further, as the data that indicates the structures may be represented by either dark portions or bright portions of the design file 220, during a sizing process, edges of the structures may be moved inward or outward by a first amount. The first amount may be less than a minimum width of the structure.

The design application 218 may be executed by the controller 212 to perform biasing at the cell level of the design file 220. Each of the cells may correspond to an area of interest identified within the design file 220. Biasing may include feature sizing of the pattern structure data contained in the cells of the design file 220. Cell level sizing of a design file may be completed such that for two overlapping cells, if the corresponding drawing data is sized inward, a gap is not formed between the cells. Similarly, if drawing data is sized upward, a space between cells is maintained such that spacing may be resolved during the digital lithography process.

Figure 3:
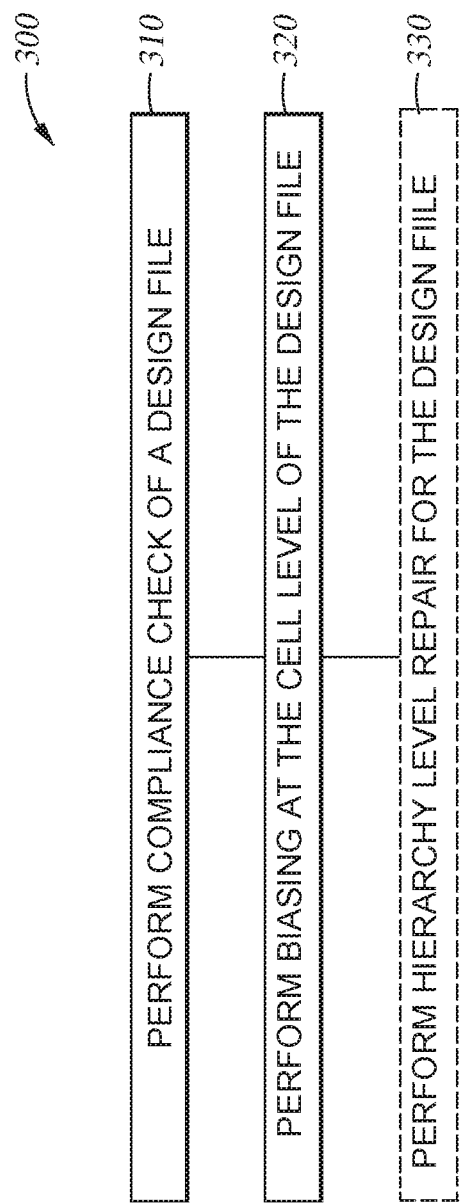
FIG. 3 is a flow chart of a method for verifying a design file, according to one or more embodiments.

FIG. 3 illustrates a method 300 for preparing a design file (e.g., the design file 220) for digital lithography, according to one or more embodiments. At operation 310, one or more compliance checks of the design file is performed. For example, the one or more compliance checks may include three compliance checks of the design file. The compliance checks may include identifying the data where an inter-cell interaction occurs. Further, the compliance checks may include identifying all non-orthogonal edges in a cell interacting region. Non-orthogonal edges are flagged as errors. Further, the one or more compliance checks may include a biasing down check during which the design file 220 is checked for overlapping regions. Any overlapping regions within one or more cells should is compared to a target biasing down threshold. Non-compliant overlapping regions correspond to overlapping regions which have less overlap than the target biasing down threshold. Further, for biasing up, the one or more compliance checks may check the cells for the space violations after biasing up is completed. For selective biasing and grey tone, the one or more compliance checks may include determining if a reference layer and the target layers produce different results for both cell level and hierarchical level operations. The design application 218 is executed by the controller 212 to perform one or more compliance checks of the design file 220. Performing the compliance check may include identifying one or more areas of interest within the cells of the design file 220 and comparing the cells to one or more compliance rules. The compliance check is described in further detail with regard to FIG. 4.

At operation 320, biasing is performed at the cell level of the design file 220. Biasing may include biasing up or biasing down at the cell level without considering the effect of the nearby polygons from other cell instances in the hierarchy. Biasing can be applied globally or to selected regions. The results of biasing at the cell level may not match the results generated by a global sizing process from the top-level design cell as the results from a biasing process may generate insufficient overlaps between structure elements as identified by the operation 310. The operation 320 may be applied to design data that passes or satisfies the compliance checks of operation 310. For example, some non-compliance errors may not be repairable the operation 330. Design files comprising such errors may be flagged as failing the compliance check and biasing may not be performed on such design file. Further, the amount of processing time utilized by the operation 320 as compared to traditional global sizing using a hierarchical geometry engine is reduced as the operation 320 does not consider inter-cell interactions. Further, the operation 320 maintains the hierarchical structure the same as the inputted design file 220.

At operation 330, hierarchy level repair of the design file generated by the operation 320. The design application 218 may be executed on the controller 212 and perform a hierarchical level repair of the outputted design file from the operation 320. Hierarchy level repair of the design file may be completed based upon a determination that the design file is non-compliant. A hierarchy level repair process may be completed when cell level biasing down process is completed during operation 320. For example, the hierarchy level repair process may include filling the gaps smaller than two times the biasing down amount. The gaps may be introduced by the biasing down operation performed during the operation 320 and may be the result of not enough overlap regions identified by the operation 310. Performing a hierarchy level repair of the output of operation 320 may add additional data at the common parent cell of the interacting cell instances. However, unlike the traditional global biasing, the repair operation may be limited to a smaller scope or area and is less likely to cause large hierarchy flattening. For example, the hierarchically level repair may be applied to about 2% or less of the design file. Accordingly, the impact on the amount of data volume is limited for the hierarchical level repair of the operation 330. Additionally, the traditional global resizing may result in hierarchy flattening which may increase the amount of data volume that is transferred to the controller 122. Employing the compliance rules of operation 310 may reduce the data volume by at least about 90% as compared to traditional methods of validating and preparing a design file for digital lithography. Further, the operation 330 is optional and may be omitted from the method 300.

Figure 4:
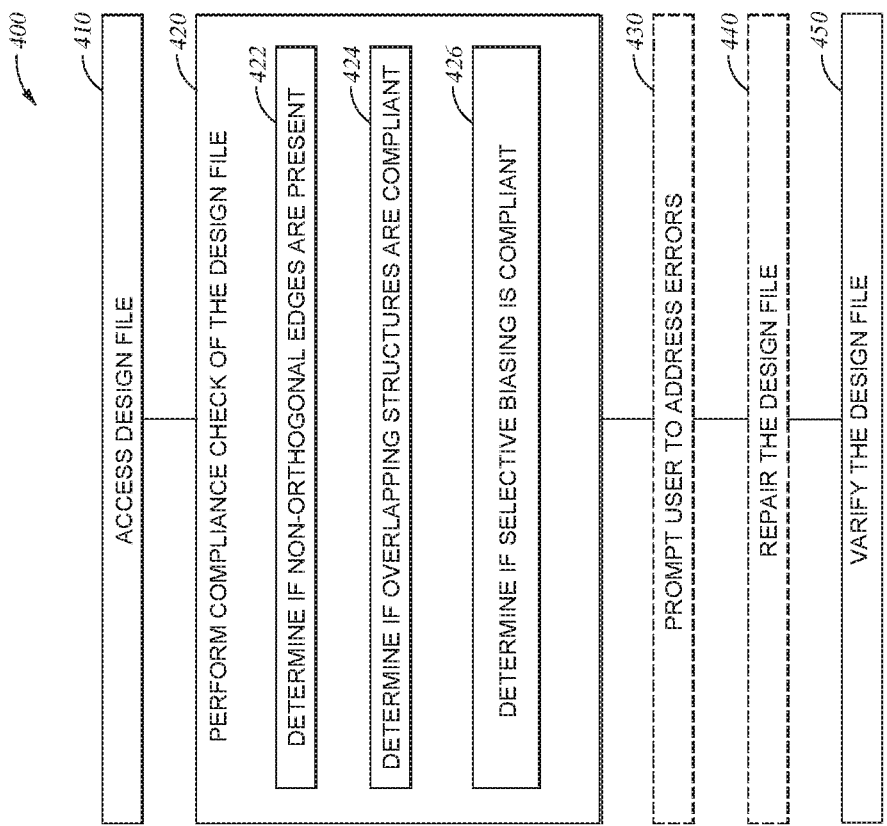
FIG. 4 is a flow chart for determining a compliant design file, according to one or more embodiments.
Figure 5:
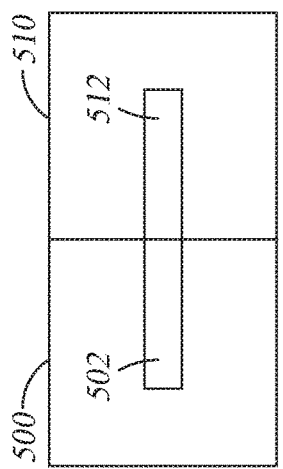
FIGS. 5, 6, 7, 8 and 9 are schematic illustrations of cell structures, according to one or more embodiments.

FIG. 4 illustrates a method 400 for verifying a design file, according to one or more embodiments. For design files determined to be compliant with the compliance rules as described with regard to operation 420 of the method 400, the result generated using cell level biasing and repair is substantially similar to biasing using a traditional hierarchical geometry engine. However, the volume of data provided to the digital lithography device 101 for digital lithography is reduced when utilizing the compliance rules as described with regard to method 400. For example, when utilizing global sizing, for each non-compliant location a gap may be present between the cells and one additional polygon may be needed to preserve the correctness of the corresponding biasing resulting in an increased the data volume. Further, design files determined to comprise non-orthogonal interaction edges may be rejected as such errors may not be repairable. The verification process as described with regard to the method 400 may be used to correlate with the amount of data provided to the digital lithography device 101.

At operation 410, a design file is accessed. For example, the design file 220 may be accessed from the memory 216. The design application 218 may access the design file 220 from the memory 216 and identify one or more areas of interest within the design file 220.

At operation 420, a compliance check of the design file is performed. For example, the design application 218 is executed on the controller 212 and applies one or more rules to the design file 220 to determine whether or not the design file is compliant. Determining non-compliant locations may include detecting non-orthogonal structures, insufficient overlapping structures, and/or selective operation differ between cell and hierarchical level, as mentioned above. Operations 422-426 describe the compliance check in further detail.

At operation 422, the design application 218 determines whether or not non-orthogonal edges are present within the areas of interest of the cells. Determining non-orthogonal edges may include determining if edges of overlapping structures may be at angles other than 0 degrees or 180 degrees. For example, the design application 218 may identify one or more structures, or polygons, and areas of interest of between cells, identify one or more edges from the structures, and determine whether or not the identified edges are non-orthogonal to each other. If non-orthogonal edges are identified, the corresponding area of interest may be marked as being non-compliant and added to a list of errors.

Figure 6:
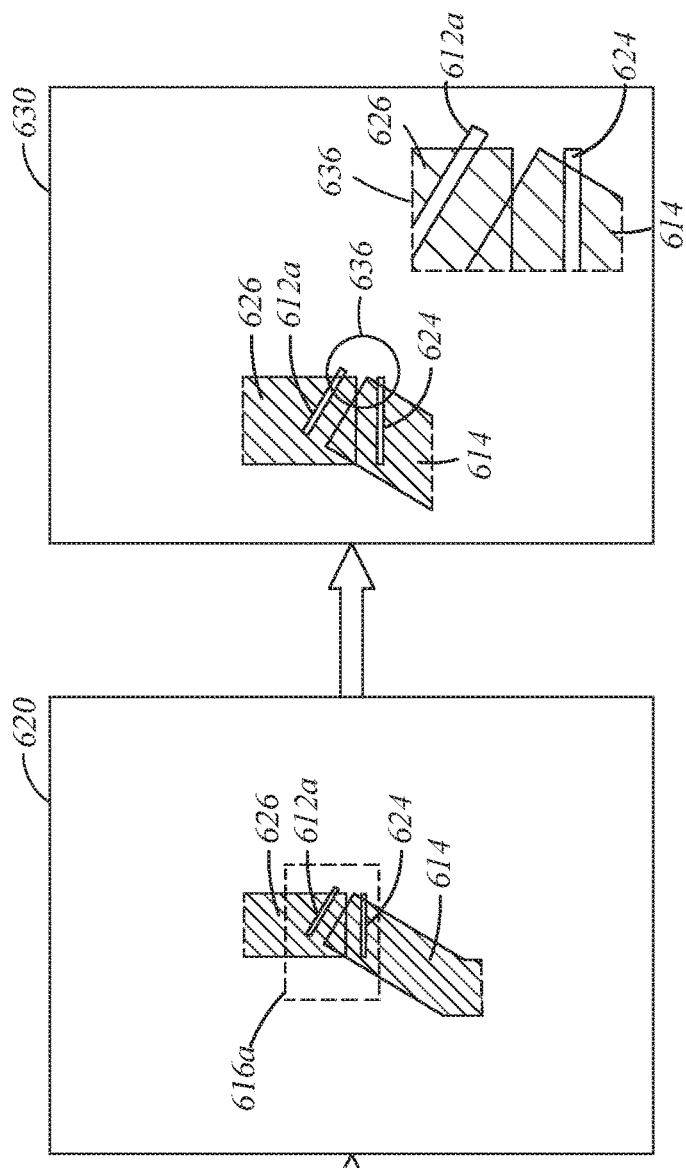

The areas of interest are determined by the design application 218 by analyzing a design file to detect the interactions of structures of adjacent cells and flagging the detected interactions as areas of interest. With reference to FIG. 6, the design application 218 may determine the areas of interest 616 by detecting inter-cell interactions between the structure 614 and the structures of other cells within a common hierarchical layer. Interacting structures are structures that at least partially overlap. Further, the interacting structures are in a common hierarchical layer. The view 610 of the cell 600 includes the areas of interest 616 (e.g., the area of interest 616*a* and the area of interest 616*b*) which correspond to interactions between the structure 614 with the structures of other adjacent cells. For example, the area of interest 616*a* corresponds to where the structure 614 interacts with a structure of a first cell and the area of interest 616*b* corresponds to where the structure 614 interacts with a structure of a second cell. One or more of the areas of interest may be omitted in instances where the structure 614 is found to not interact with a corresponding structure of another cell. Further, as illustrated in view 620, the area of interest 616*a* corresponds to the interaction between the structure 614 and the structure 626 at the hierarchy level.

The design application 218 further generates markers within the cells, where the markers correspond to the edges of the structures of the cells. The markers may be utilized to detect non-compliant areas of interests and corresponding non-compliant cells. As illustrated in FIG. 6, the cell 600 is marked with markers 612 which correspond to the edges of the structure 614. The design application 218 utilizes the markers of the overlapping edges of overlapping structures to determine if an area of interest is compliant or not. For example, detecting non-compliant areas of interest includes selecting markers that correspond to the interaction between two structures and determining whether or not an angle formed between the selected markers is different than 0 degrees 180 degrees. With reference to FIG. 6 and view 620, the markers 612*a* and 624 are selected based on the determination that the markers 612*a* and 624 correspond to the overlapping edges of the interaction between the structures 614 and 626. Stated another way, markers 612*a* and 624 are selected as the markers 612*a* and 624 identify a hierarchical interaction of the structures 614 and 626. Accordingly, the markers 612*a* and 626 may be used by the design application 218 to determine whether or not the area of interest 616*a* is compliant. For example, as indicated by area 636 of view 630, a non-orthogonal edge is detected and flagged between structures 614 and 626. Determining the non-orthogonal edge comprises determining whether an angle between the markers 612*a* and 624 is at a value other than 0 degrees or 180 degrees. For example, the design application 218 measures the angle formed between the markers 612*a* and 624 and if the value is different than 0 degrees or 180 degrees, the area of interest 616*a* is determined to be non-compliant. When the determination is made that the angle formed between selected markers 612*a* and 624 has a value other than 0 degrees or 180 degrees the area of interest is determined to be non-compliant by the design application 218 and the cell 600 is marked as being non-compliant and is added to a list of errors. Alternatively, if the areas of interest were determined to be free from non-orthogonal edges, the area of interest and the corresponding cell is determined to be compliant. Further, design files determined to comprise one or more non-compliant cells may be rejected.

Figure 7:
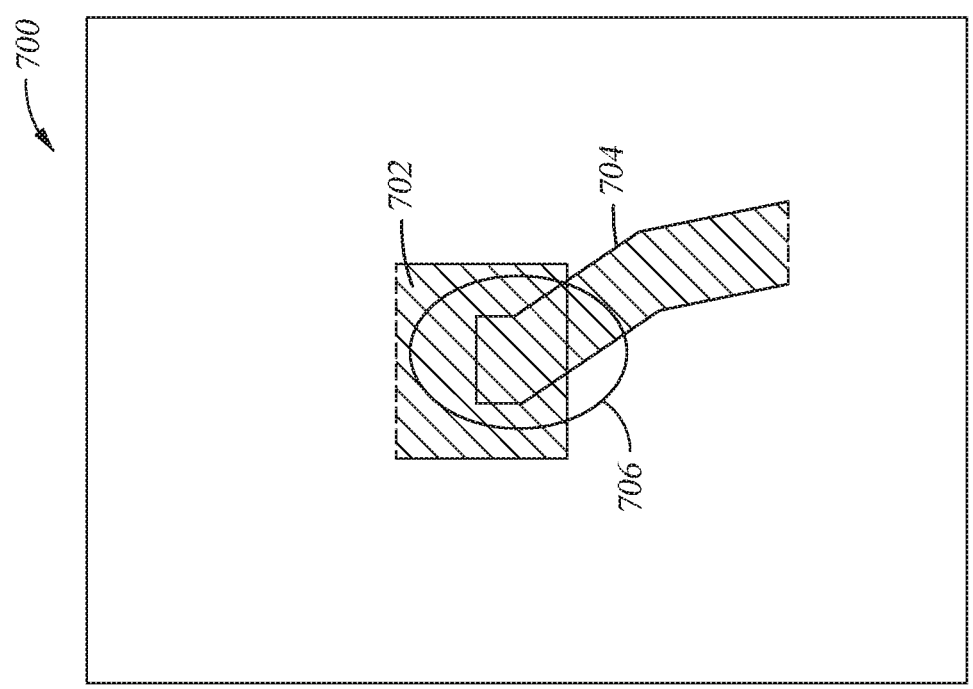

At operation 424, the design application 218 determines whether or not the overlapping structure elements are compliant. For example, the design application 218 is executed by controller 212 to identify overlapping edges within an area of interest, determine a number of the overlapping edges, and determine whether or not the number of overlapping edges satisfies an edge threshold. The edge threshold may be set such that a compliant area of interest of a cell has no more than three adjacent edges within an overlapping area. Further, an area of interest that satisfies an overlapping threshold may be an area of interest that has no more adjacency edges than that defined by the edge threshold. With reference to FIG. 7, area of interest 700 may be evaluated by the design application 218 to determine whether or not the area of interest 700 fails to satisfy the overlapping threshold. For example, the area of interest 700 includes structures 702 and 704. The design application 218 compares the number of edges of the structure 704 that overlap the structure 702 with an overlapping threshold. The overlapping threshold may have a value of three. Further, the overlapping threshold may have a value of less than three or greater than three. As shown in FIG. 7 the number of edges of the structure 704 that overlaps the structure 702 is five, the area of interest 700 may be marked as being non-compliant and added to the list of errors.

Figure 8:
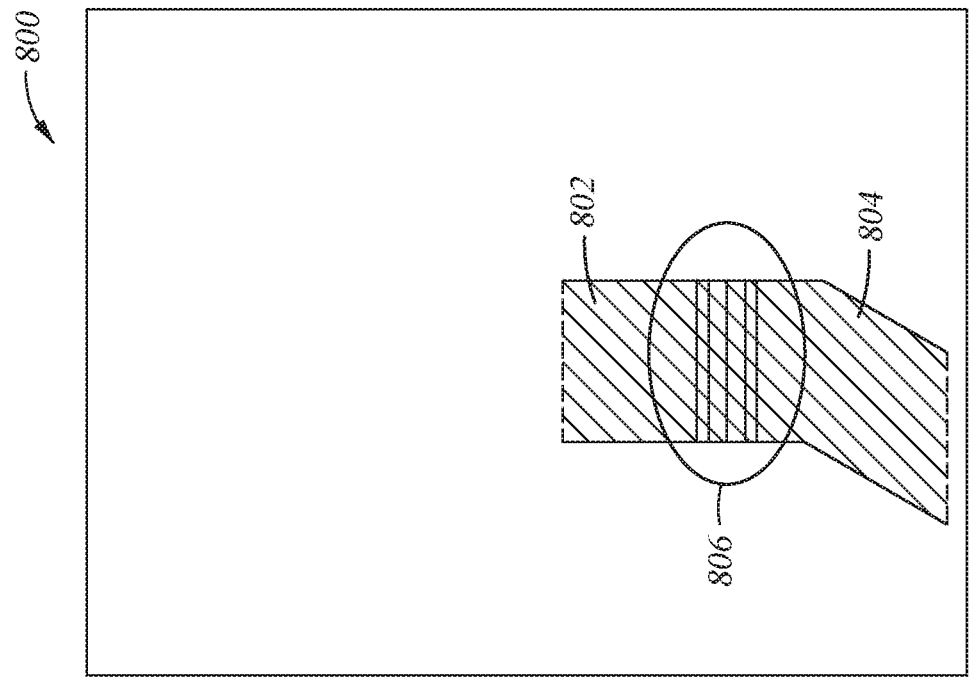

Further, the operation 424 may include identifying one or more edges of at least one of the structure 702 and the structure 704 and determining if the distance of overlap is less than a distance threshold. If the amount of overlap less than the distance threshold, the corresponding area of interest may be indicated as being non-compliant. With reference to FIG. 8, an area of interest 800 comprising structures 802 and 804 is illustrated. The structure 804 overlaps structure 802 by a first amount which is indicated by region 806. The amount of overlap is compared by the design application 218 against an overlap threshold to determine whether or not the cell comprising the area of interest 800 is compliant. An overlap threshold may be a value that is at least the same as the targeted bias amount (e.g., the amount at which the cells are biased during resizing). If the amount of overlap indicated by region 806 fails to satisfy the overlap threshold, the cell including the area of interest 800 may be determined to be non-compliant and added to a list of errors.

Figure 9:
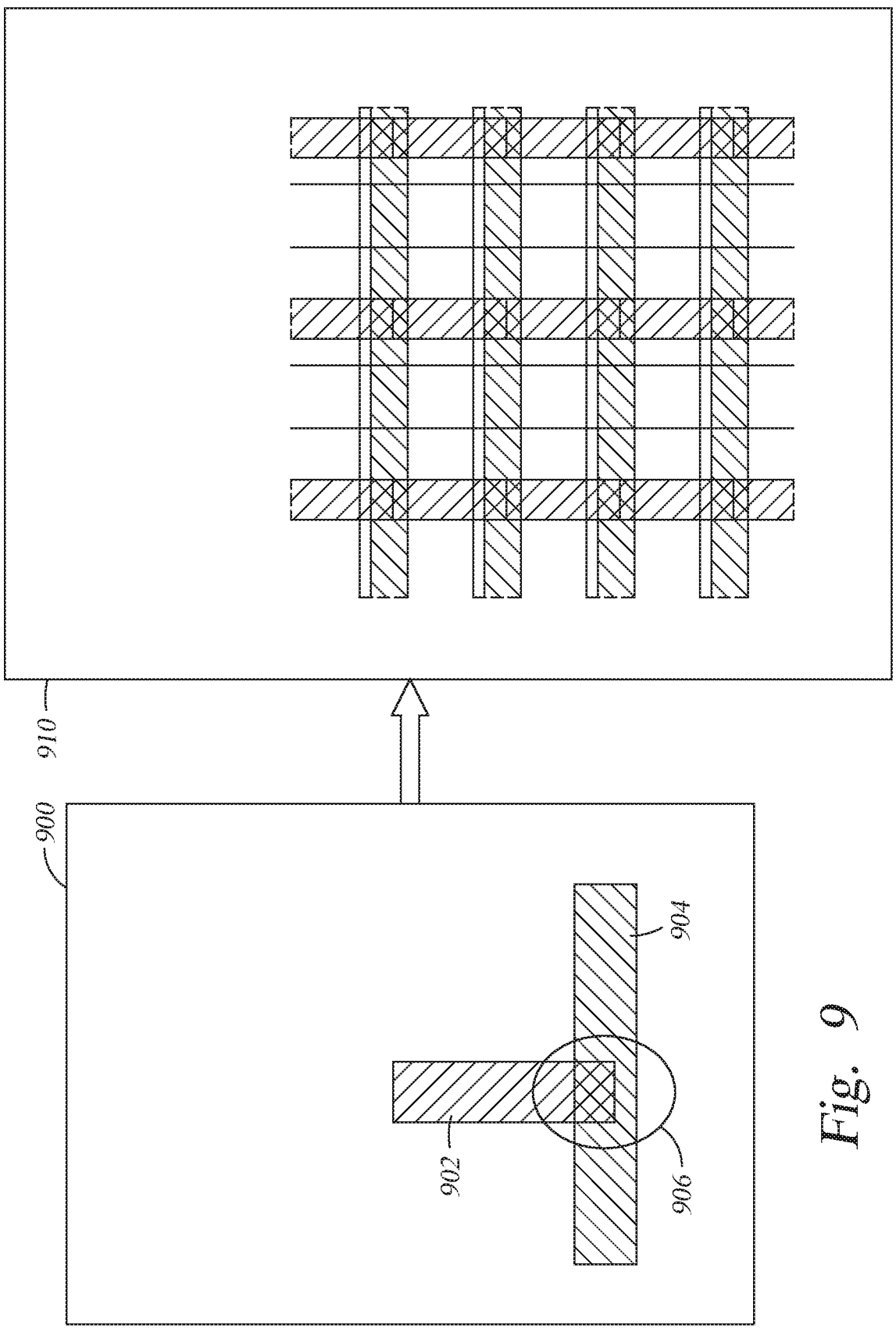

At operation 426, the design application 218 determines whether or not selective biasing errors exist within the cell composition. For example, the design application 218 may identify one or more structures within a cell and compares the structures to composite hierarchical data of the design file, e.g., the design file 220, to determine whether or not a discrepancy exist during the selection process. Errors may be determined to exist when a structure is omitted from a cell. For example, as shown in FIG. 9, the area of interest 900 includes reference layer 902 and target layer 904. However, as indicated from the hierarchical composition view 910, the reference layer 902 passes over another target layer 904 from a different cell instance. Accordingly, the cell comprising the area of interest 900 may be identified as including an error and being non-compliant. Thus, the cell comprising area of interest 900 may be added to the list of errors.

At operation 430, a user is prompted to address errors. For example, a user may be prompted to address the errors identified within a list of errors. The list of errors may be generated by the operation 420. Further, the list of errors may be evaluated and grouped based on their severities. For example, non-compliant errors generated by the operation 422 and 426 may be grouped and identified for corrective action. Further, the non-compliant error from operation 424 may be compared to a percentage threshold to determine whether or not the design file passes the compliance check. For example, if 95% of the edges identified during operation 424 are determined to satisfy the overlapping threshold, the design file passes the check. However, if more than 5% of the edges identified during operation 424 are determined to not satisfy the overlapping threshold, the design file failed the check. Further, a reduction in the data volume transferred to the controller 122 may be achieved when the percentage of edges that satisfy the overlapping threshold is more than about 95%. Additionally, or alternatively, the design application 218 may be executed by the controller 212 and generate the list of errors based on the compliance check of operation 420.

The design application 218 executed by the controller 212 may output the list of errors to a user via an I/O device along with a request for the user to update the design file 220 to correct the identified errors. For example, the list of errors may be presented to a user via a display device of the verification device 130. The user may update the design file 220 to correct the identified errors. After the design file has been corrected, the method 400 may be utilized to evaluation and verify the updated design file. Alternatively, the user may choose to ignore the request to correct the identified errors and communicate the design file 220 to the digital lithography device 101. However, using a design file that has not been verified may result in the generation of errors during the digital lithography process.

Method 400 may additionally include optional operation 440, repairing the design file. For example, a design file is repaired by filling the gaps (or spaces) between cell elements at one or more of the non-compliant areas. Operation 440 may be implemented in response to a detection or determination of the non-compliant errors from operation 424 for automatic repair of the design file. Alternatively, the method 400 may include the operation 440 as an alternative to or in addition to requesting a user to address the identified errors to reduce the data volume. Further, the combination of the cell level biasing down in addition to patching gaps between cells or cell elements may produce the equivalent result as compared to the conventional global biasing results. Additionally, the described cell level bias operation does not change the hierarchical structure, and accordingly, does not increase the amount of data volume that is transferred to the controller 122. The data volume may be increased during the design repair operation (e.g., operation 440), and, as such, design files that have less non-compliant errors will generate a more compacted design file.

At operation 450, the design file is verified. For example, the design file 220 may be verified by the design application 218 as being compliant and ready for the digital lithography process when no errors are identified during the verification process (e.g., the method 400). After the design file has been verified, the design file 220 may be communicated to the digital lithography device 101. For example, the design file 220 may be communicated to the controller 122 of the digital lithography device 101 via the network interface 214 and a communication network. Alternatively, or additionally, the design file 220 may be saved to a removable memory before being transferred to the digital lithography device 101.

Verification of a design file used in a digital lithography process aids in the reduction of errors that may occur during the digital lithography process. For example, the verification process may identify errors win the design file before the design file is provided to the digital lithography process. Further, the volume of data provided to the digital lithography process may be reduced by performing the verification at the cell level with adjustments made to the design file made at the hierarchy level.

The methods presented in FIGS. 3 and 4 may be stored within a computer program product and executed on a controller (e.g., the controller 122 and/or 212). The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may include the memory 216. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, or a floppy disk, among others.

Computer readable program instructions described herein can be downloaded to respective computing/processing devices from a computer readable storage medium or to an external computer or external storage device via a network, for example, the Internet, a local area network, a wide area network and/or a wireless network. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to the controller 122 and/or the controller 212. Further, the computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in the memory 216.

While the foregoing is directed to examples of the present disclosure, other and further examples of the disclosure may be devised without departing from the basic scope thereof, and the scope thereof is determined by the claims that follow.

What is claimed is:

1. A method, comprising:
    accessing a design file for a digital lithography device from a memory;
    detecting areas of interest within the design file based on interactions between structures of cells within one or more hierarchical layers of the design file;
    applying one or more compliance rules to the design file to determine compliance of the design file by:
        detecting non-orthogonal edges within the areas of interest based on detecting an edge of a first structure of the structures being non-orthogonal with an edge of a second structure of the structures, wherein the first structure and the second structure are overlapping with each other;
        detecting non-compliant overlapping structures within the areas of interest; and
        detecting a non-compliant interaction between a reference layer of the design file and a target layer of the design file; and
    verifying the design file in a response to a comparison of a number of the non-orthogonal edges, the non-compliant overlapping structures and the non-compliant interactions to a threshold, wherein the verified design file is output to the digital lithography device to pattern a substrate based on the verified design file.

2. The method of claim 1, wherein detecting the non-orthogonal edges further comprises:
    detecting a region of overlap between the first structure and the second structure.

3. The method of claim 2, wherein detecting the region of overlap comprises:
    generating a plurality of markers around the first structure and the second structure; and
    selecting a first marker and a second marker of the plurality of markers that identify an interaction region of the first structure and the second structure, and wherein determining if the first structure forms an orthogonal edge with the second structure comprises determining if the first marker is orthogonal with the second marker.

4. The method of claim 1, wherein detecting the non-compliant overlapping structures comprises at least one of:
    comparing an amount of a third structure that extends into a fourth structure to a first threshold;
    identifying one or more edges of at least one of the third structure and the fourth structure that is non-orthogonal in a region of overlap between the third structure and the fourth structure; and
    comparing a number of adjacent edges of the third structure within the region of overlap to an edge threshold.

5. The method of claim 4, wherein a location corresponding to the third and fourth structures is determined to be non-compliant in response to one or more of:
    the amount of the third structure that extends into the fourth structure exceeding the first threshold;
    identifying at least one non-orthogonal edge in the region of overlap; and
    the number of adjacent edges exceeding the edge threshold.

6. The method of claim 1, detecting the non-compliant overlapping structures comprises:
    identifying a third structure that overlaps with a fourth structure;
    determining an amount of overlap between the third and fourth structures; and
    comparing the amount of overlap to a distance threshold.

7. The method of claim 6, wherein a location corresponding to the third structure and the fourth structure is determined to be non-compliant in response to the amount of overlap being less than the threshold.

8. A verification device for verifying a design file for digital lithography, the verification device comprises:
    a memory comprising the design file; and
    a controller configured to:
        access the design file;

detect areas of interest within the design file based on interactions between structures of cells within one or more hierarchical layers of the design file;

apply one or more compliance rules to the design file to determine compliance of the design file by:

detecting non-orthogonal edges within the areas of interest based on detecting an edge of a first structure of the structures being non-orthogonal with an edge of a second structure of the structures, wherein the first structure and the second structure are overlapping with each other;

detecting non-compliant overlapping structures within the areas of interest; and detecting a non-compliant interaction between a reference layer of the design file and a target layer of the design file; and verify the design file in response to a comparison of a number of the non-orthogonal edges, the non-compliant overlapping structures and the non-compliant interactions to a threshold, wherein the verified design file is output to a digital lithography device to pattern a substrate based on the verified design file.

9. The verification device of claim 8, wherein detecting the non-orthogonal edges further comprises:
detecting a region of overlap between the first structure and the second structure.

10. The verification device of claim 9, wherein detecting the region of overlap comprises:
generating a plurality of markers around the first structure and the second structure; and
selecting a first marker and a second marker of the plurality of markers that identify an interaction region of the first structure and the second structure, and wherein determining if the first structure fails to form an orthogonal edge with the second structure comprises determining if the first marker is orthogonal with the second marker.

11. The verification device of claim 8, wherein detecting the non-compliant overlapping structures comprises at least one of:
comparing an amount of a third structure that extends into a fourth structure to a first threshold;
identifying one or more edges of at least one of the third structure and the fourth structure that is non-orthogonal in a region of overlap between the third structure and the fourth structure; and
comparing a number of adjacent edges of the third structure within the region of overlap to an edge threshold.

12. The verification device of claim 11, wherein a location corresponding to the first and second structures is determined to be non-compliant in response to one or more of:
the amount of the third structure that extends into the fourth structure exceeding the first threshold;
identifying at least one non-orthogonal edge in the region of overlap; and
the number of adjacent edges exceeding the edge threshold.

13. The verification device of claim 8, detecting the non-compliant overlapping structures comprises:
identifying a third structure that overlaps with a fourth structure;
determining an amount of overlap between the third and fourth structures; and
comparing the amount of overlap to a distance threshold.

14. The verification device of claim 13, wherein a location corresponding to the third structure and the fourth structure is determined to be non-compliant in response to the amount of overlap being less than the threshold.

15. A computer program product for verifying a design file for digital lithography, the computer program product comprising:
a computer-readable storage medium having computer-readable program code embodied therewith, the computer-readable program code executable by one or more computer processors to:
access the design file from a memory;
detect areas of interest within the design file based on interactions between structures of cells within one or more hierarchical layers of the design file;
apply one or more compliance rules the design file to determine compliance of the design file by:
detecting non-orthogonal edges within the areas of interest based on detecting an edge of a first structure of the structures being non-orthogonal with an edge of a second structure of the structures, wherein the first structure and the second structure are overlapping with each other;
detecting non-compliant overlapping structures within the areas of interest; and
detecting a non-compliant interaction between a reference layer of the design file and a target layer of the design file; and
verify the design file in a response to a comparison of a number of the non-orthogonal edges, the non-compliant overlapping structures and the non-compliant interactions to a threshold, wherein the verified design file is output to a digital lithography device to pattern a substrate based on the verified design file.

16. The computer program product of claim 15, wherein detecting the non-orthogonal edges comprises:
detecting a region of overlap between the first structure and the second structure within the design file; and
determining if the first structure fails to form an orthogonal edge with the second structure.

17. The computer program product of claim 16, wherein detecting the region of overlap comprises:
generating a plurality of markers around the first structure and the second structure; and
selecting a first marker and a second marker of the plurality of markers that identify an interaction region of the first structure and the second structure, and wherein determining if the first structure forms the orthogonal edge with the second structure comprises determining if the first marker is orthogonal with the second marker.

18. The computer program product of claim 15, wherein detecting the non-compliant overlapping structures comprises at least one of:
comparing an amount of a third structure that extends into a fourth structure to a first threshold;
identifying one or more edges of at least one of the third structure and the fourth structure that is non-orthogonal in a region of overlap between the third structure and the fourth structure; and
comparing a number of adjacent edges of the third structure within the region of overlap to an edge threshold.

19. The computer program product of claim 18, wherein a location corresponding to the first and second structures is determined to be non-compliant in response to one or more of:
the amount of the third structure that extends into the fourth structure exceeding the first threshold;

identifying at least one non-orthogonal edge in the region of overlap; and the number of adjacent edges exceeding the edge threshold.

20. The computer program product of claim 15, detecting the non-compliant overlapping structures comprises:

identifying a third structure that overlaps with a fourth structure;

determining an amount of overlap between the third and fourth structures; and comparing the amount of overlap to a distance threshold.

* * * * *